United States Patent
Shmueli et al.

(10) Patent No.: US 9,105,785 B2
(45) Date of Patent: Aug. 11, 2015

(54) LUMINESCENT SOLAR CONCENTRATOR

(75) Inventors: Eitan Shmueli, Aventura, FL (US);
Amnon Leikovich, Tel Aviv (IL);
Renata Reisfeld, Jerusalem (IL)

(73) Assignee: Green-Sun Energy Ltd., Jerusalem (IL)

( * ) Notice: Subject to any disclaimer, the term of this patent is extended or adjusted under 35 U.S.C. 154(b) by 572 days.

(21) Appl. No.: 13/142,816

(22) PCT Filed: Dec. 29, 2009

(86) PCT No.: PCT/IL2009/001226
§ 371 (c)(1),
(2), (4) Date: Feb. 21, 2012

(87) PCT Pub. No.: WO2010/076791
PCT Pub. Date: Jul. 8, 2010

(65) Prior Publication Data
US 2012/0138124 A1    Jun. 7, 2012

(30) Foreign Application Priority Data

Dec. 31, 2008    (IL) .......................................... 196312

(51) Int. Cl.
*H01L 31/0232* (2014.01)
*H01L 31/055* (2014.01)
*H01L 31/054* (2014.01)

(52) U.S. Cl.
CPC .......... *H01L 31/055* (2013.01); *H01L 31/0547* (2014.12); *Y02E 10/52* (2013.01)

(58) Field of Classification Search
USPC .................... 136/246, 247, 252, 259; 438/72; 257/E31.127
See application file for complete search history.

(56) References Cited

U.S. PATENT DOCUMENTS

| | | |
|---|---|---|
| 4,488,047 A | 12/1984 | Thomas |
| 4,629,821 A | 12/1986 | Bronstein-Bonte et al. |
| 5,202,290 A | 4/1993 | Moskovits |
| 5,229,320 A | 7/1993 | Ugajin |
| 5,482,890 A | 1/1996 | Liu et al. |
| 5,543,354 A | 8/1996 | Richard et al. |
| 5,935,343 A | 8/1999 | Hollick |
| 6,312,835 B1 | 11/2001 | Wang et al. |
| 6,538,129 B1 | 3/2003 | Terpetschnig et al. |
| 2002/0015120 A1* | 2/2002 | Kameyama et al. ............ 349/95 |

(Continued)

FOREIGN PATENT DOCUMENTS

| | | |
|---|---|---|
| CN | 101263608 A | 9/2008 |
| DE | 10 2005 043 572 A1 | 3/2007 |

(Continued)

OTHER PUBLICATIONS

Batchelder et al., "Luminescent solar concentrators. 1: Theory of operation and techniques for performance evaluation," *Applied Optics* 18(18):3090-3110, Sep. 15, 1979.

(Continued)

*Primary Examiner* — Susan D Leong
(74) *Attorney, Agent, or Firm* — Seed IP Law Group PLLC

(57) ABSTRACT

The present invention is directed to luminescent solar concentrators, processes for the production of the same and uses thereof. The luminescent solar concentrators comprise a composite substrate including two or more films containing luminescent compounds and wavelength-selective mirrors, which concentrators may be connected to photovoltaic cells.

14 Claims, 2 Drawing Sheets

(56) References Cited

U.S. PATENT DOCUMENTS

Figure 1:
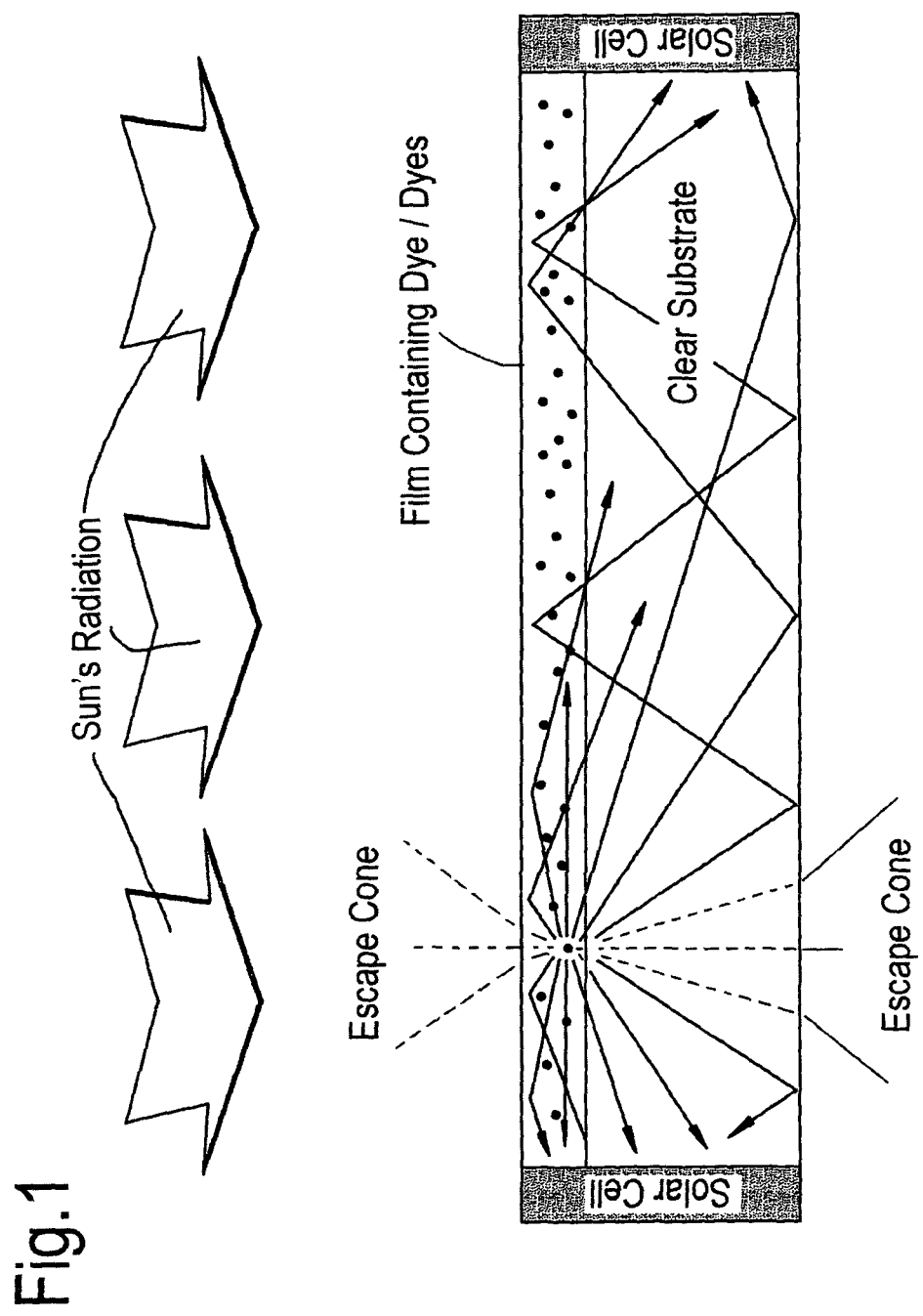

| | | | |
|---|---|---|---|
| 2007/0119496 | A1 | 5/2007 | Baldo et al. |
| 2008/0149165 | A1 | 6/2008 | Hoeks et al. |
| 2008/0223438 | A1 | 9/2008 | Xiang et al. |
| 2008/0245411 | A1 | 10/2008 | Hammermann et al. |
| 2009/0027872 | A1* | 1/2009 | Debije et al. .................... 362/84 |
| 2009/0056791 | A1* | 3/2009 | Pfenninger et al. ........... 136/247 |

FOREIGN PATENT DOCUMENTS

| | | |
|---|---|---|
| JP | 2007-27271 A | 2/2007 |
| WO | 2004/003102 A2 | 1/2004 |
| WO | 2004/038745 A2 | 5/2004 |
| WO | 2005/054340 A1 | 6/2005 |
| WO | 2006/088369 A2 | 8/2006 |
| WO | 2008/145113 A2 | 12/2008 |
| WO | 2008/157621 A2 | 12/2008 |
| WO | 2009/002943 A2 | 12/2008 |

OTHER PUBLICATIONS

Broer et al., "Wide-band reflective polarizers from cholesteric polymer networks with a pitch gradient," *Nature* 378:467-469, Nov. 30, 1995.

Communication Pursuant to Article 94(3) EPC, dated Jul. 30, 2012, for corresponding EP Application No. 09809041.8, 4 pages.

Currie et al., "High-Efficiency Organic Solar Concentrators for Photovoltaics," *Science* 321:226-228, Jul. 11, 2008.

Goetzberger et al., "Solar Energy Conversion with Fluorescent Collectors," *Appl. Phys.* 14:123-139, 1977.

Goetzberger et al., "Fluorescent Planar Collector-Concentrators for Solar Energy Conversion," *Adv. Solid State Phys.* 19:427-451, 1979.

International Search Report, mailed Mar. 23, 2011, for PCT/IL2009/001226, 3 pages.

Katsis et al., "Vitrified Chiral—Nematic Liquid Crystalline Films for Selective Reflection and Circular Polarization," *Chem. Mater.* 11(6):1590-1596, 1999.

Reisfeld et al., "Planar solar energy convertor and concentrator based on uranyl-doped glass," *Nature* 274:144-145, Jul. 13, 1978.

Reisfeld et al., "Improved planar solar convertor based on uranyl neodymium and holmium glasses," *Nature* 283:281-282, Jan. 17, 1980.

Swartz et al., "Photon trapping and energy transfer in multiple-dye plastic matrices: an efficient solar-energy concentrator," *Optics Letters* 1(2):73-75, Aug. 1977.

Weber et al., "Luminescent greenhouse collector for solar radiation," *Applied Optics* 15(10):2299-2301, Oct. 1976.

\* cited by examiner

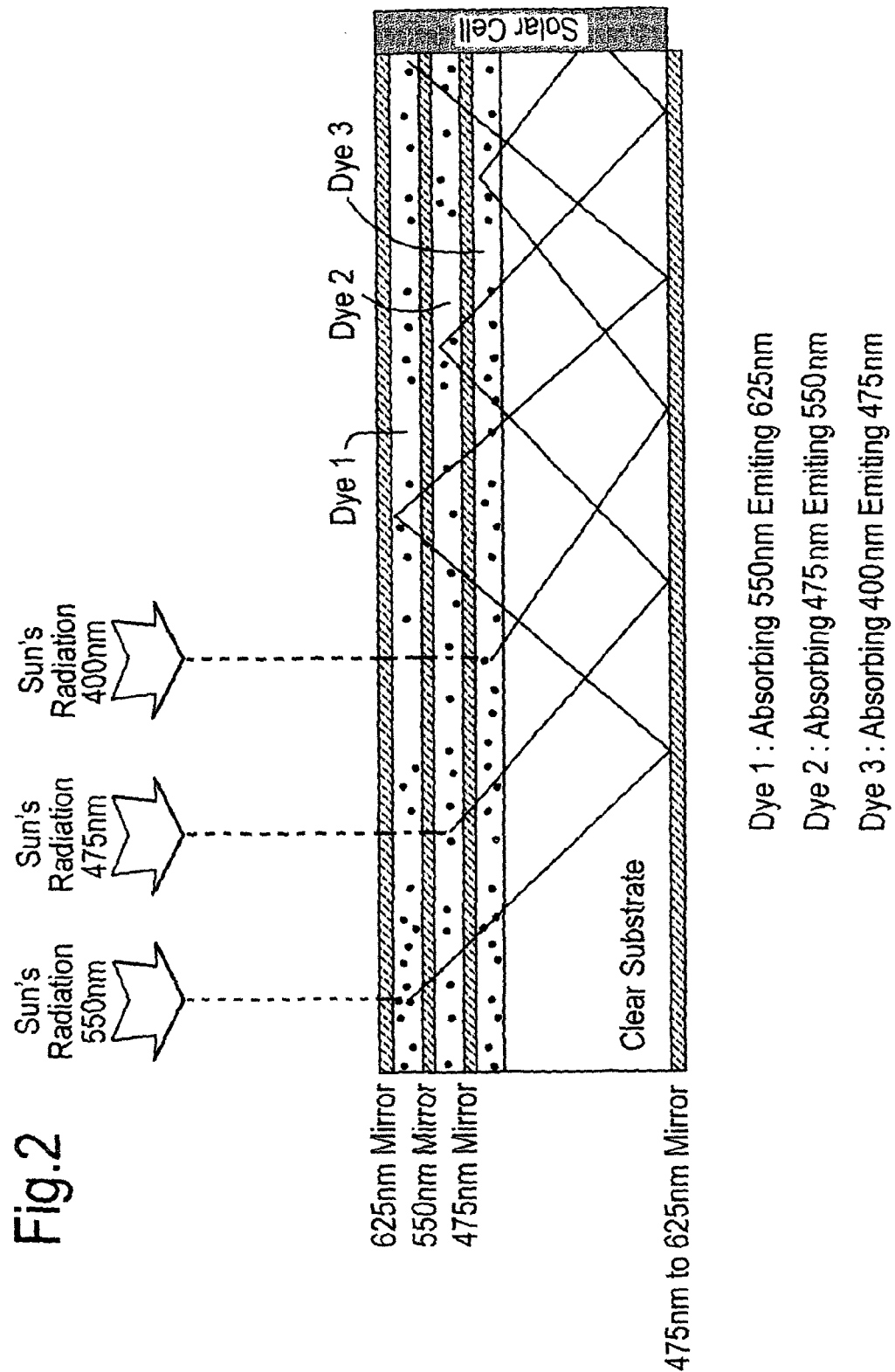

LUMINESCENT SOLAR CONCENTRATOR

FIELD OF THE INVENTION

The present invention relates to methods for producing a luminescent solar concentrator (LSC). This invention further relates to an LSC having a wider absorption range and higher efficiency, minimizing inherent losses and reducing manufacturing costs of the LSC.

BACKGROUND OF THE INVENTION

The World's conventional energy supplies, based mainly on readily available fossil sources, are rapidly diminishing. The main short-term alternative to the energy crisis, the harnessing of nuclear fission energy, inspires much controversy, and practical realization of nuclear fusion technology has not yet occurred.

Solar energy provides an obvious alternative energy source, which is clean and non-hazardous. Proper methods for the collection, concentration, storage, and conversion of solar light to be a practical solution is as yet lacking, since to date solar light is diffuse and intrinsically intermittent. Nonetheless, the feasibility of solar photovoltaic cells represents a desirable energy solution if as yet impractical.

One of the limitations of solar power to date is the large amount of silicon needed per kW for the preparation of solar cells, which problem is compounded by the fact that the preparation of doped high-grade silicon requires exceedingly large amounts of electrical energy.

One means utilized for the concentration of solar light involves the use of parabolic mirrors (or an assembly of such reflecting surfaces used for solar furnaces) or Fresnel lenses, for incorporation in gallium arsenide (GaAs) photovoltaics. The heliostat-type equipment needed for tracking of the daily apparent motion of the sun is expensive, and the method is inefficient due to losses of most of the diffused light, which constitutes about 60% of the light reaching the earth's surface in Europe and in most regions of the United States.

Planar luminescent concentrators were first proposed by Weber and Lambe (J. Appl. Optics 15, 2299 (1976)) and then elaborated in greater detail simultaneously by Goetzberger and Greubel (Appl. Phys. 14, 123 (1977)) and by Swartz, Cole and Zewail (Optics Letters/, 73 (1977)). The subject has been further analyzed by Batchelder, Zewail and Cole (Appl. Optics 18, 3090 (1979)) and by Goetzberger and Wittwer (Adv. Solid State Phys. 19, 427 (1979)) and Reisfeld et al. (Nature 274, 144 (1978); Nature 283, 281 (1980)) with emphasis on the use of fluorescent organic dye-stuffs. To date, all of the methods described using planar luminescent concentrators suffer the limitation of poor energy efficiency and great expense in construction of the devices. Moreover, in such devices, an escape cone for emitted light is an invariable outcome, as well as self absorption and low overall quantum efficiency of mixed dyes to absorb larger sections of the sun's radiation in an attempt to increase energy yields through Foerster energy transfer.

Use of multiple plate "tandem" configurations has not provided an ideal solution. Although such use results in efficient absorption, the concentration ratio is reduced by 3 to 4, depending on the number of plates employed and, as a result, entails using a large area of cells, thereby defeating the purpose of reducing the amount of cells required.

To date an ideal solar concentrator providing for high yields, with cost-effective processes for the preparation thereof is lacking.

SUMMARY OF THE INVENTION

In one embodiment, this invention provides a luminescent solar concentrator (LSC) comprising:
i) a composite substrate comprising:
   an apical surface comprising a first film containing a first luminescent compound, wherein an apical surface of said film is proximal to a first wavelength-selective mirror, which mirror is transmissive for a range of light wavelengths and is reflective for wavelengths corresponding to those at which said first luminescent compound emits light;
   at least a second film positioned beneath said first film, wherein said second film contains a second luminescent compound, and an apical surface of said second film is proximal to a second wavelength-selective mirror, which mirror is transmissive for a range of light wavelengths and is reflective for wavelengths corresponding to those at which said second luminescent compound emits light; wherein said first luminescent compound emits light at wavelengths which are longer than those at which said second luminescent compound emits light;
   a basal surface comprising a third wavelength-selective mirror, which mirror is reflective for wavelengths corresponding to those at which luminescent compounds positioned there-above in the composite substrate emit light;
   a transparent body positioned between a basal surface of said second luminescent film and an apical surface of said third wavelength-selective mirror; and
ii) optionally, at least one photovoltaic cell positioned adjacent to at least one edge of said composite substrate, which cell receives emitted and reflected photons from said first and at least second luminescent films and from said mirrors, which act as a waveguide trapping said photons there-within, and converts such photons into electricity.

In some embodiments, the first luminescent compound absorbs light at wavelengths which correspond to or longer than those at which said second luminescent compound emits light. In some embodiments, the composite substrate further comprises a third film containing a third luminescent compound, wherein an apical surface of said film is proximal to a fourth wavelength-selective mirror, which mirror is transmissive for a range of light wavelengths and is reflective for wavelengths corresponding to those at which said third luminescent compound emits light and which filter is proximal to a basal surface of said second film and wherein said second luminescent compound emits light at wavelengths which are longer than those at which said third luminescent compound emits light.

In some embodiments, the second luminescent compound absorbs light at a wavelengths which correspond to or longer than those at which said third luminescent compound emits light. According to this aspect and in some embodiments, the first luminescent compound emits light in a range of from about 550-650 nm, and in some embodiments, the second luminescent compound emits light in a range of from about 425-575 nm and in some embodiments, the third luminescent compound emits light in a range of from about 350-450 nm.

In some embodiments, the transparent body is comprised of a glass or plastic and in some embodiments the transparent body is comprised of an optical-grade acrylic polymer.

In some embodiments, the film comprises a sol-gel matrix or a polymer, and in some embodiments, the film comprises poly(methyl methacrylate) (PMMA).

In some embodiments, the luminescent compound absorbs light of a wavelength in a range of between about 300 nm to about 700 nm.

In some embodiments, this invention provides a solar collection assembly comprising an array of the luminescent solar concentrators of this invention. In some embodiments, the array of luminescent solar concentrators positions each concentrator edge-to-edge with respect to an adjoining concentrator and at least one photovoltaic cell is disposed between each of the edge intersections.

In some embodiments, this invention provides a process for the preparation of the luminescent solar concentrators (LSC) as described hereinabove, said process comprising:
i) preparing a substrate comprising a transparent material having a basal surface comprising said third wavelength-selective mirror.
ii) preparing each, of a first film and a second film and adding said first luminescent compound and said second luminescent compound to said first film and said second film, respectively;
iii) applying said second film onto an apical surface of the substrate prepared in (i) such that said second film has a basal surface proximal to an apical surface of said substrate;
iv) positioning said second wavelength-selective mirror such that said mirror is proximal to the apical surface of said second film;
v) applying said first film onto an apical surface of second selective wavelength mirror positioned in (iv); and
vi) positioning said first selective wavelength mirror such that said mirror is proximal to the apical surface of said first film applied in (v).

In some embodiments, applying in the processes of the invention is via drop casting, sputter coating, spin coating, dip coating, spray coating or roller coating.

In some embodiments, this invention provides a method for the conversion of solar energy to electricity, said method comprising positioning at least one luminescent solar concentrator (LSC) for the collection and concentration of solar energy, said luminescent solar concentrator comprising a composite substrate, said substrate comprising:
an apical surface comprising a first film containing a first luminescent compound, wherein an apical surface of said film is proximal to a first wavelength-selective mirror, which mirror is transmissive for a range of light wavelengths and is reflective for wavelengths corresponding to those at which said first luminescent compound emits light;
at least a second film positioned beneath said first film, wherein said second film contains a second luminescent compound, and an apical surface of said second film is proximal to a second wavelength-selective mirror, which mirror is transmissive for a range of light wavelengths and is reflective for wavelengths corresponding to those at which said second luminescent compound emits light;
wherein said first luminescent compound emits light at wavelengths which are longer than those at which said second luminescent compound emits light;
a basal surface comprising a third wavelength-selective mirror, which mirror is reflective for wavelengths corresponding to those at which luminescent compounds positioned there-above in the composite scaffold emit light;
a transparent body positioned between a basal surface of said second film and an apical surface of said third selective wavelength mirror; and
whereby at least one photovoltaic cell is positioned adjacent to at least one edge of said composite substrate, which cell receives emitted or reflected photons or a combination thereof from said first and at least second films and said mirrors, and converts such photons into electricity, thereby being a method of converting solar energy to electricity.

In some embodiments, the method results in the abrogation or diminution of the creation of an escape cone upon solar irradiation of said luminescent solar concentrator.

In some embodiments, according to this aspect, the composite substrate further comprises a third film containing a third luminescent compound, wherein an apical surface of said film is proximal to a fourth wavelength-selective mirror, which mirror is transmissive for a range of light wavelengths and is reflective for wavelengths corresponding to those at which said third luminescent compound emits light and which mirror is proximal to a basal surface of said second film and wherein said second luminescent compound emits light at wavelengths which are longer than those at which said third luminescent compound emits light.

In some embodiments, the absorption efficiency of said luminescent solar concentrator comprising at least a first and second film is greater than an absorption efficiency in a luminescent solar concentrator, which does not comprise a second film proximal to or bounded apically by said second wavelength-selective mirror, as a consequence of the absence of said second wavelength-selective mirror.

DETAILED DESCRIPTION OF THE INVENTION

This invention is directed to luminescent solar concentrators (LSCs), which are so constructed so as to eliminate energy losses due to the presence of an escape cone, as found in other concentrators. The LSCs of the present invention have reduced losses of energy associated with self absorption and energy transfer losses arising from energy transfer between one dye and another, as found in other LSC systems. The LSCs of the subject invention possess the advantages of LSC tandem configuration models, such as higher transfer efficiency and higher absorption efficiency, without the need for multiple or larger cell area.

The trapping efficiency in previous LSC models is associated with significant losses as a result of incorporation of some of the light emitted from the fluorescent dye in the substrate. Some losses arise as a consequence of the emission resulting in escape from the waveguide creating an escape cone which amounts to about a 25% loss, depending on the refractive index of the substrate as described below and as illustrated in FIG. 1.

The total efficiency of an LSC is governed by the following physical loss factors: Critical cone loss corresponds to the fraction $\cos\theta_c$ of the isotropic luminescence passing through the spherical shell (with differential volume $4\pi r^2$ dr with the fluorescent species at the center), which undergoes consecutive total reflections by being emitted outside the critical cone. Hence, $$L = 1 - \cos\theta_c = 1 - ((n^2-1)/n^2)^{1/2}$$

$$\theta_c = \arcsin(1/n), \text{ frequently called } \sin^{-1}(1/n)$$

$$\sin\theta_c = 1/n \qquad (2)$$

where n is the refractive index of the isotropic LSC plate.

An example of trapping efficiencies of the plates with various refractive indices are shown below:

| n = | 1.414 | 1.556 | 1.743 | 2.000 |
|---|---|---|---|---|
| $\theta_c =$ | 45° | 40° | 35° | 30° |
| $\eta_{trap} =$ | 0.7071 | 0.7660 | 0.8191 | 0.8660 |

Where n is the refractive index and the absorption efficiency $\eta_{abs}$ is the fraction of incident solar photons absorbed by the luminescent species. The solar photons here occur in direct and diffuse light. In most calculations, air-mass 1 (AM 1) is taken as standard but it should be noted that the detectable solar flux depends strongly on the atmospheric conditions.

If the energy flux per wave-number V (v) is divided by the photon energy hv at that wave-number (=hcv), the total photon flux N(v) is obtained in the unit photons/m²s (cm⁻¹). The total flux of energy and of photons is arrived at by the integration:

$$I=\int V(\overline{v})d\overline{v}=hc\int \overline{v}N(\overline{v})d\overline{v}$$

where the integration limits of zero and infinity do not imply that V and N may not vanish over large regions.

Additionally the quantum efficiency of Foerster energy transfer in a single plate containing multiple dyes is calculated by the multiplication of the all the absorption efficiencies and the multiplication of the quantum efficiency of each dye. Since the efficiencies of dyes in longer wavelengths are generally low, the overall efficiency is substantially low and the lowest efficiency dye is the one that is mostly responsible for the overall results. For example, using typical dyes with quantum efficiencies as follows:

$QE1=0.8qe$ at 400 nm;
$QE2=0.6qe$ at 475 nm, and
$QE3=0.4qe$ at 550 nm;
the trapping efficiency of each of the dyes is $TE=0.9$.
The overall trapping efficiencies for 400 nm light absorbed and transferred from dye 1 is:

$$OE=QE1 \times QE2 \times QE3 \times TE \times TE \times TE$$

or $$0.139=0.8 \times 0.6 \times 0.4 \times 0.9 \times 0.9 \times 0.9.$$

The overall efficiency for 475 nm light absorbed and transferred from dye 2 is:

$$OE=QE2 \times QE3 \times TE \times TE,$$

or $$0.194=0.6 \times 0.4 \times 0.9 \times 0.9;$$

and the overall efficiency for 550 nm light absorbed and transferred from dye 3 is:

$$OE=QE3 \times TE,$$

or $$0.36=0.4 \times 0.9.$$

Moreover, losses in such systems arise because of the creation of an escape cone, and such losses typically approach a 25% total loss, so the loss of efficiency is even greater.

Thus, in our example, when:

$$OE(dye\ 1) 0.139 \times 0.75 = 0.104;$$

$$OE(dye\ 2) 0.194 \times 0.75 = 0.145;\ and$$

$$OE(dye\ 3) 0.36 \times 0.75 = 0.27;$$

the average efficiency from all said wavelengths in the above-described system is 0.173.

In the present invention, such escape losses are virtually eliminated regardless of the refractive index of the substrate as the emitted energy on behalf of the luminescent compounds does not get reabsorbed by another luminescent compound (i.e. there is no resonance energy transfer between luminescent compounds). Moreover, the trapping efficiency is increased, due to the ability to incorporate a higher concentration of the luminescent compounds, which was not possible in previous systems, since the luminescent compounds chemically interacted with each other when placed proximally and at high concentration on the same plane of the substrate.

The present invention incorporates a wavelength-selective mirror, which is apically proximal to, and in some embodiments, bounds a film containing a luminescent compound and is characterized in that the mirror reflects light of a wavelength corresponding to that at which the luminescent compound emits light and is concurrently transparent to light of a wavelength corresponding to that at which the luminescent compound absorbs light. The devices and methods of this invention are predicated on the incorporation of at least two films, each of which film is proximal to, and in some embodiments, bounded apically or on its top by, a wavelength-selective mirror, which is characterized by the described reflection characteristics such that each mirror reflects light of a wavelength corresponding to that at which the proximally located luminescent compound emits light.

The devices and methods of this invention position the film comprising the luminescent compound which emits light at a longer wavelength apically or on top, with respect to the film comprising a second luminescent compound emitting light at a shorter wavelength, relative thereto. The basal or bottom surface of the device is proximal to, or in some embodiments, bounded by a wavelength-selective mirror, which reflects light of all wavelengths corresponding to that at which each luminescent compound emits light.

The luminescent solar concentrators of this invention comprise a composite substrate which is operationally connected to a photovoltaic cell. The composite substrates of this invention comprise at least two films, each film comprising a different luminescent compound, and a wavelength-selective mirror positioned there-between, a wavelength-selective mirror proximal to and in some embodiments, bounding the most apical film, a transparent body placed basal to the films and an additional wavelength-selective mirror positioned basal to the transparent body.

The positioning of the films within the devices and according to the methods of the invention is such that each film is positioned apically with respect to a wavelength-selective mirror which reflects light of a wavelength corresponding to that at which a luminescent compound contained within the film absorbs light. The film located most apically contains a luminescent compound emitting light at a longer wavelength than a film placed more basally, relative thereto, and the wavelength-selective mirror positioned there-between is reflective for a wavelength corresponding to that at which the luminescent compound in the film positioned basal to the mirror emits light.

Such positioning obviates the absorption of light by a luminescent compound emitted by another luminescent compound.

The terms "at least one", as well as the terms "a" or "an" with regard to the indicated material when utilized herein, refer to the inclusion of one or more of such material. It is to be understood that the term "at least one of a group of" when referring to generic groups refers to inclusion of one species of each generic group described, as well as multiple species within each group.

The composite substrates of this invention comprise an apical surface comprising a first film containing a first luminescent compound, wherein an apical surface of said film is bounded by a first wavelength-selective mirror, which mirror is transmissive for a range of light wavelengths and is reflective for wavelengths corresponding to that at which said first luminescent compound emits light.

The term "apical" is a relative term denoting a spatial placement of the indicated material. Apical is to be understood to refer to higher placement of the indicated material along a vertical axis, relative to placement of another material along such vertical axis. Apical is understood commonly to be "a top" or "on top".

The first film is proximal to, or in some embodiments, bounded by a first wavelength-selective mirror on its apical surface.

The term "mirror" refers to a material having a surface that specularly reflects incident light. The term "wavelength-selective mirror" is to a material having a surface that specularly reflects incident light of a particular wavelength, and is transmissive for incident light of other wavelengths. A variety of such mirrors are known in the literature and are commercially available, for example through Newport Corporation. These wavelength selective mirrors can be wavelength tuned (see for example Katsis et al (1999) Chem. Mater. 11, 1590)) or bandwidth tuned (see for example Broer et al (1995) Nature 378, 467).

In some embodiments, a relatively thin wavelength-selective mirror is utilized. In some embodiments, the thickness of the wavelength-selective mirror does not exceed 100 nm, preferably it does not exceed 20 nm. Usually, the thickness of the aforementioned mirror will exceed 5 nm. It is noted that the wavelength-selective mirror of the present invention may suitably comprise two or more layers that together function as a wavelength selective mirror, e.g. a polymeric stack or a combination of cholesteric layers.

In some embodiments, the choice in wavelength-selective mirror is such that the transparency of the wavelength-selective mirror for light absorbed by the photoluminescent material and the reflectivity of the same mirror for the emitted radiation are concurrently maximized.

The term "proximal to" refers to a spatial positioning, such that the indicated materials are in proximity with each other, however, such elements may nonetheless have additional materials positioned therebetween. For example, and in some embodiments, the apical surfaces of the films comprising luminescent compounds as described herein, are positioned proximally to appropriate wavelength-selective mirrors and such positioning may entail direct positioning of the mirror directly on top of the appropriate film, or in some embodiments, a transparent body or other material may be positioned between the apical surface of the film and the mirror. It is to be understood that any other material may be positioned between materials described as being proximally located with respect to each other, with the caveat that such positioning does not negatively impact the functioning of the devices of this invention. The term "negatively impact" is to be understood as referring to a reduction, or a significant reduction in successful or optimal operation of the LSC devices and methods of this invention.

The term "bounded" refers to positioning over most of the indicated surface, such that a film bounded apically by the wavelength-selective mirror contains at least 65%-100% of the film's apical surface is covered by the mirror. In some embodiments, the term "bounded" with respect to apical bounding of the film is intended to refer to positioning of such a mirror on the apical surface and optionally bounding the sides of the film as well, such that only the basal surface or bottom of the film is not bounded by the mirror.

Films as used in the devices and in accordance with the methods of this invention comprise a luminescent compound. Such compound may be associated with the film by any means, including non-covalent association as well as covalent association. Such films may comprise, in some embodiments, a sol-gel matrix, a polymer, etc. The polymer may comprise PMMA, or other suitable polymers. In some embodiments, the film comprises an expoxy resin. In some embodiments, the film is acrylate-, methacrylate-, epoxy-, vinyl-ether-, styrene-, thiol-ene- or oxethane-based. In some embodiments, the film comprises a polymer, which comprises any suitable material, for example a transparent polymer, glass, transparent ceramic or combinations thereof. In some embodiments, the transparent polymer is thermosetting or thermoplastic. In some embodiments, the transparent polymer is (semi-)crystalline or amorphous. In some embodiments, the transparent polymer is a polymethyl methacrylate, polystyrene, polycarbonate, cyclic olefin copolymer, polyethylene terephtalate, polyether sulphone, cross-linked acrylate, epoxy, urethane, silicone rubber or a combination of the same, or a copolymer of the polymers.

In some embodiments, the film comprises an organic-inorganic sol-gel composite coating. The coating is an optical clear glass material based on organically modified siloxanes (ormosils) and formed by a sol-gel process. The sol-gel matrix includes composite hybrid materials, such as di-urethane-siloxane (DURS) (synthesized separately from Isocianato-propyl-trimethoxy-silylane (ICPTMOS) and Polyethylene glycol (PEG)), providing elasticity and flexibility of the coatings. The sol-gel coating is based on various alkoxides such as: tetra-ethoxy-silane (TEOS); tetra-methoxy-silane (TMOS); glycid-oxypropyl-trimethoxy-silane (GLYMO); phenyl-trimethoxy-silane (PhTMOS); and zirconium-n-tetrapropoxide (TPOZ).

In some embodiments, the luminescent compounds incorporated within the films of this invention comprise DFSB-K82-Yellow; DFSB-K-61-Clear Blue; DFWB-K1-60-Orange; substituted pyrans (such as DCM), coumarins (such as Coumarin 30), rhodamines (such as Rhodamine B or Rhodamine Red or Rhodamine 640), BASF® Lumogen™ series, perylene derivatives, Exciton® LDS series, Nile Blue, Nile Red, DODd, oxazines, pyridines, the styryl' series (Lambdachrome®), dioxazines, naphthalimides, thiazines, stilbenes, quantum dots, for example as described in U.S. Pat. Nos. 5,482,890; 5,543,354; 5,202,290; 5,229,320, other luminescent compounds such as those described in World Intellectual Property Organization Publication No. WO/2004/003102, U.S. Pat. Nos. 6,312,835, 6,538,129, and others as will be appreciated by the skilled artisan.

It will be appreciated by the skilled artisan that many methods may be utilized to incorporate the desired luminescent compound within the films, as herein described, which methods will optimize incorporation and maintain a desired orientation of the compound, and physico-chemical characteristics of the compound such that efficient luminescence can occur. Such methods may comprise use of cross-linking agents for incorporation of the compound, while care is taken to ensure luminescence capability.

In some embodiments, the amount of dye present in each film is between 0.05 and 0.5 $g/m^2$, or in some embodiments, the amount of dye present in each film is between 0.1 and 0.3 $g/m^2$, or in some embodiments, the amount of dye present in each film is between 0.15 and 0.25 $g/m^2$. It is to be understood that the variance in the amount of dye may be a reflection of the properties of the particular dye or substrate or film employed in the LSC of this invention, or a combination thereof, as will be appreciated by the skilled artisan.

In some embodiments, the method entails preparing a solution of the polymer or sol gel and adding the luminescent compound thereto and drop casting the solution onto the material which will comprise the proximal surface to the basal surface of the film, i.e. the film is prepared by drop casting, or in some embodiments, sputter coating onto the surface of material which is most proximally, basally located to the respective film. In some embodiments, the film is prepared by spin coating, or in some embodiments, by dip coating, or in some embodiments, by spray coating, or in some embodiments, by roller printing or in some embodiments, by vacuum deposition onto the surface of material which is most proximally, basally located to the respective film.

In some embodiments, such material will comprise the transparent body, as described herein, and in some embodiments, such material will comprise a wavelength-selective mirror.

In some embodiments, this invention provides a process for the preparation of the luminescent solar concentrator (LSC), which process comprises preparing a substrate comprising a transparent material having a basal surface comprising a wavelength-selective mirror, and preparing a solution of each of a first film and a second film and adding a first luminescent compound and said second luminescent compound to the first film and second film, respectively. The process further comprises applying the second film onto an apical surface of the substrate such that the second film has a basal surface proximal to an apical surface of the substrate. The process further comprises positioning the second wavelength-selective mirror such that said mirror is proximal to and in some embodiments bounds the apical surface of the second film and applying the first film onto an apical surface of the second selective wavelength mirror and positioning the first selective wavelength mirror such that the mirror is proximal to and in some embodiments, bounds the apical surface of the first film.

In some embodiments, methods of assembly of the LSC of this invention will comprise a variation of that disclosed in WO 2006/088369, or for example in Currie M. J. et al., Science (2008) Vol. 321. no. 5886, pp. 226-228.

The LSC devices of this invention comprise at least a second film positioned beneath the first film, wherein the second film contains a second luminescent compound, and an apical surface of said second film is proximal to and in some embodiments, bounded by a second wavelength-selective mirror, which mirror is transmissive for a range of light wavelengths and is reflective for wavelengths corresponding to those at which said second luminescent compound emits light and which mirror is proximal to and in some embodiments bounds a basal surface of said first film.

In some embodiments, the first and second films comprise the same materials, with the exception of the luminescent compounds incorporated therein, and optionally other agents utilized for such incorporation (for example, the inclusion of non-zero length cross-linking agents). In some embodiments, the first and second films comprise different materials, yet the refractive properties of such films are comparable.

In some embodiments, each film may incorporate two or more luminescent compounds, however the compounds will possess the property such that each compound's emission spectra is relatively comparable to that of another incorporated within the same film, in order that the wavelength-selective mirror located apically with respect to such film reflects all light of a wavelength corresponding to that emitted from any of the dyes incorporated within the film. According to this aspect, such multiple compounds contained within the single film may possess different absorption spectra, however the wavelengths corresponding thereto will correspond to or be greater than that of a compound incorporated within any basally located film.

In some embodiments, the LSC devices of the invention comprise a film in which the first luminescent compound emits light at wavelengths which are longer than those at which said second luminescent compound emits light. In some embodiments, the LSC devices comprise films in which luminescent compounds incorporated within a first film emit light at wavelengths which are longer than those of luminescent compounds incorporated within a basally located second film.

In some embodiments, the LSC devices of the invention comprise a composite substrate further comprising a third or additional (fourth, fifth, sixth, etc.) film containing a third (fourth, fifth, sixth, etc.) luminescent compound, wherein an apical surface of said film is proximal to, and in some embodiments, bounded by a fourth wavelength-selective mirror, which mirror is transmissive for a range of light wavelengths and is reflective for wavelengths corresponding to those at which said third (or fourth, or fifth, or sixth, etc.) luminescent compound emits light and which filter is proximal to or bounds a basal surface of said second (or preceding) film and wherein said second (or preceding) luminescent compound emits light at wavelengths, which are longer than those at which said third (fourth, fifth, or sixth) luminescent compound emits light. In some embodiments, according to this aspect of the invention, the second (or preceding) luminescent compound absorbs light at wavelengths which correspond to or longer than those at which said third (or fourth or fifth, or subsequent.) luminescent compound emits light.

In some embodiments, the first luminescent compound emits light at a range of from about 550-650 nm, and in some embodiments, the second luminescent compound emits light a range of from about 425-575 nm, and in some embodiments, the third luminescent compound emits light at a range of from about 350-450 nm.

The LSC devices of this invention and methods of use of the same have a most basal surface comprising a wavelength-selective mirror, which mirror is reflective for wavelengths corresponding to those at which said apically located luminescent compounds emit light.

In some embodiments, the wavelength-selective mirror on the most basal surface of the LSCs of this invention is reflective for light of any wavelength. In some embodiments, the wavelength-selective mirror is reflective for light of a wavelength which corresponds to that at which any luminescent compound incorporated within the LSC emits light. In some embodiments, the wavelength-selective mirror is reflective for light at a range of about 300-700 nm.

The LSC comprises a transparent body positioned between a basal surface of the second luminescent film and an apical surface of the third wavelength-selective mirror. In some embodiments, the LSC comprises multiple films, with wavelength-selective mirrors positioned between film layers, which wavelength-selective mirrors are reflective for light at wavelengths at which luminescent compounds incorporated within films located apically with respect to such mirrors emit light. According to this aspect, the most basally located film is positioned proximally to the transparent body, such that the transparent body is positioned between the most basally located film and the apical surface of a wavelength-selective mirror, which is reflective for light of the broadest range of wavelengths of any other wavelength-selective mirror in the device.

The transparent body may comprise any appropriate material, as will be appreciated by the skilled artisan, and may include any transparent polymer, glass, transparent ceramic or combinations thereof. In some embodiments, the transparent body will comprise an optical-grade acrylic polymer.

In some embodiments, at least one photovoltaic cell is positioned adjacent to at least one edge of the composite substrate, which cell receives reflected photons from the films comprising luminescent compounds, as described herein and converts such photons into electricity.

In some embodiments, the LSC of the invention function as a waveguide, which is effective in trapping photons emitted and reflected within the LSC, and conveying such photons to proximally located and operationally connected photocells, which in turn convert such photons into electricity.

In some embodiments, the photovoltaic cell may comprise any known in the art, for example, those available commercially, or as described in United States Patent Application No. 20070119496, U.S. Pat. Nos. 5,935,343; 4,629,821; or World Intellectual Property Organization Patent Application Publication No. WO/2004/038745 or others.

In some embodiments, the photovoltaic cell can be attached at a 90- or 45-degree angle to the collector surface, whereby an angle of 45 degrees allows the cell to absorb direct light as well as concentrated light, thereby increasing the total surface efficiency. It is to be understood that the photovoltaic cell may be positioned at any angle, with respect to the LSC, which facilitates absorption of the concentrated light.

In some embodiments, this invention provides a solar collection assembly comprising an array of luminescent solar concentrators of this invention. In some embodiments, the array comprises LSC, wherein each concentrator is placed edge to edge with respect to an adjoining concentrator and in some embodiments, at least one photovoltaic cell is disposed between each of the edge intersections.

The LSCs of this invention are applicable for use in methods for the conversion of solar energy to electricity. In some embodiments, such methods may comprise positioning at least one luminescent solar concentrator (LSC) of this invention in a manner appropriate for the collection and concentration of solar energy, whereby at least one photovoltaic cell is positioned adjacent to at least one edge of the composite substrate of the LSCs of this invention, which cell receives emitted and/or reflected photons from the first and at least second or subsequent films, and converts such photons into electricity, thereby being a method of converting solar energy to electricity.

In some embodiments, the method results in the abrogation or diminution of the creation of an escape cone upon solar irradiation of the luminescent solar concentrator.

In some embodiments, the composite substrate further comprises a third (or fourth, or subsequent) film containing a third (or fourth, or subsequent) luminescent compound, wherein an apical surface of said film is proximal to and in some embodiments, bounded by a fourth (or fifth or subsequent) wavelength-selective mirror, which filter is transmissive for a range of light wavelengths and is reflective for wavelengths corresponding to those at which said third (or preceding) luminescent compound emits light and which filter is proximal to and in some embodiments bounds a basal surface of said second (or preceding) film and wherein said second (or preceding) luminescent compound emits light at wavelengths which are longer than that at which said third (or subsequent) luminescent compound emits light.

In some embodiments, the absorption efficiency of the LSCs of this invention is greater than an absorption efficiency in a luminescent solar concentrator, which does not comprise multiple film layers comprising luminescent compounds, where individual layers within the LSC are characterized in that a basal surface of such layer is proximal to a wavelength-selective mirror, which is reflective for light at wavelengths corresponding to those at which the luminescent compound within the layer positioned apically to the mirror absorb light.

In some embodiments, the LSCs of this invention are useful in applications other than conventional harnessing and conversion of solar energy to electrical energy. In some embodiments, the light output achieved from the LSCs of this invention may be applied directly for visual effects rather than electrical generation.

Further application of the invention may be, for instance, road signs or markers, to generate electricity, or to induce or enhance the visual safety effects of these signs, outdoor furniture that generates electricity or visual light effects, transparent, semi-transparent, or opaque roadside sound barriers that generate electricity or visual lighting effects, etc.

In some embodiments, extraterrestrial applications of the LSCs of this invention are envisioned, for example, solar sails' for spacecraft propulsion may be equipped with the LSC according to the invention, for simultaneous generation of electricity via PV cells irradiated by the LSC collected radiation (and optionally also direct irradiation by the sun) as well as propelling the craft.

It is to be understood that any application of the LSCs of this invention whereby solar energy is concentrated and utilized or converted to another energy form is to be considered as part of this invention.

While the invention will now be described in connection with certain preferred embodiments in the following examples and with reference to the appended drawings, so that aspects thereof may be more fully understood and appreciated, it is not intended to limit the invention to these particular embodiments. On the contrary, it is intended to cover all alternatives, modifications and equivalents as may be included within the scope of the invention as defined by the appended claims. Thus, the following examples which include preferred embodiments will serve to illustrate the practice of this invention, it being understood that the particulars shown are by way of example and for purposes of illustrative discussion of preferred embodiments of the present invention only and are presented in the cause of providing what is believed to be the most useful and readily understood description of formulation procedures as well as of the principles and conceptual aspects of the invention.

In the drawings,

FIG. 1 is a cross-sectional view depicting a single LSC plate wherein the clear plate, i.e., the transparent plate, is provided with an upper film containing a dye. Absorption of sunlight by the film containing dye, the dye emits light at a longer wave length. Light traveling above a critical angle is piped through the clear substrate due to a total refection and reaches the solar cells attached at the edges of the substrate; and FIG. 2 is a cross-sectional view depicting an embodiment of an LSC of this invention, comprising a single clear plate above which alternating film and mirror layers are positioned. Absorption of sunlight of the appropriate wavelength by the film containing the respective corresponding dye, results in light emission at a longer wave length. Light traveling above a critical angle is piped through the clear substrate due to a total refection and reaches the solar cells attached at the edges of the substrate.

EXAMPLE 1

Energy Losses in Prior LSC Devices

FIG. 1 schematically depicts the principle of operation of previous LSC devices, which typically comprise a single film 1 containing one or more luminescent compounds 2, 3 positioned on a clear substrate 4, which result in a lack of collection (depicted as an escape cone 5 in the figure) of some of the light emitted by the compounds subsequent to irradiation of the device by the sun. Such light is reflected out of the device; and therefore is not collected within the solar cells positioned proximally thereto, and represents a significant loss of energy in such systems.

EXAMPLE 2

An Embodiment of an LSC Device of this Invention

FIG. 2 schematically depicts an embodiment of a device of this invention. The devices of this invention, in marked contrast to previous devices, comprise two or more luminescent compounds, but each luminescent compound is located within a film which is apically bounded by a wavelength-selective mirror, which is reflective for light of a wavelength corresponding to that at which the proximally located compound emits light thereby specifically preventing or significantly diminishing the existence of an "escape cone".

The device comprises a first film 6, apically bounded by a first mirror 7, and containing a first luminescent compound, 8, which compound emits light at a selective-wavelength which corresponds in value to that which is reflected by the apically located mirror 7. A second film 9 is positioned beneath the first film, and a second selective-wavelength mirror 10 is positioned there-between. The second film incorporates a second luminescent compound 11. A third film 12 is positioned beneath the second film, and a third selective-wavelength mirror 13 is positioned there-between. The third film incorporates a third luminescent compound 14. A transparent body 15 is positioned beneath the third film and a fourth selective-wavelength mirror 16 is positioned beneath the transparent body.

In this aspect, the first mirror 7, is reflective for light of a wavelength of 625 nm, the second mirror 10, is reflective for light of a wavelength of 550 nm, the third mirror 13, is reflective for light of a wavelength of 475 nm and the fourth mirror 16 is reflective for light of a wavelength from 475 nm to 625 nm.

In this aspect, the first luminescent compound 8, absorbs light at a wavelength of 550 nm, and emits light at 625 nm, while the second luminescent compound 11 absorbs light at a wavelength of 475 nm, and emits light at 550 nm, and a third luminescent compound 14 absorbs light at a wavelength of 400 nm, and emits light at 475 nm. The figure depicts light of various wavelengths irradiating different films within an LSC of the invention.

The design of the present devices traps emitted light within the substrate, and simultaneously reflects such light within the substrate in a manner comparable to that found in fiber optic devices, to convey such light efficiently to a proximally located solar cell, preventing losses due to escape and losses due to subsequent absorption of emitted light by other proximally located luminescent compounds.

Calculation of the efficiency of the devices of this invention may be readily accomplished, using the formulae described hereinabove. When the same three luminescent compounds are applied to the devices of this invention, the overall efficiency increases, as a consequence of the retention of 95% of the emitted light reflected from the wavelength-selective mirrors. The overall efficiency therefore approximates the quantum efficiency of the dyes in each respective wavelength, with the only energy loss being a reduction in absorption efficiency.

The following calculation may be applied (based on formulae presented hereinabove:

The quantum efficiencies for the respective compounds are:

$QE1 = 0.8qe$ at 400 nm;
$QE2 = 0.6qe$ at 475 nm, and
$QE3 = 0.4qe$ at 550 nm.

When a trapping efficiency of each of the dyes is $TE = 0.9$ then the overall efficiency calculation for 400 nm light absorbed by luminescent compound 1 and trapped thereby is:

$$OE = QE1 \times TE;$$

$$0.72 = 0.8 \times 0.9.$$

The overall efficiency calculation for 475 nm light absorbed by luminescent compound 2 and trapped thereby is:

$$OE = QE2 \times TE;$$

$$0.54 = 0.6 \times 0.9.$$

The overall efficiency calculation for 550 nm light absorbed by luminescent compound 3 and trapped thereby is:

$$OE = QE3 \times TE;$$

$$0.36 = 0.4 \times 0.9.$$

The calculations yield a theoretically comparable overall efficiency values as that attainable in prior devices, however, as described, such former devices suffer from the creation of escape zones, in which an approximately 25% loss in efficiency occurs, depending upon the refractive index of the substrate.

In this example, therefore, when:

$$OE(\text{dye } 1) 0.72 \times 0.95 = 0.68;$$

$$OE(\text{dye } 2) 0.54 \times 0.95 = 0.51; \text{ and}$$

$$OE(\text{dye } 3) 0.36 \times 0.95 = 0.27;$$

the average efficiency from all of the wavelengths is 0.49, in contrast to the value of 0.173, obtained using calculations for efficiencies associated with previous devices.

In this example, utilizing a device of this invention would result in a 283% increase in efficiency over existing LSC concentrators. The increase may be greater, in fact, since higher self absorption by the compound from which light was emitted may occur as a consequence of reflection of the light as it is conducted to the solar cell. It is also possible that upon reflection and additional self-absorption of the emitted light in previous devices, additional escape cones are created, resulting in still greater losses in efficiency.

Increases in efficiency in the devices of this invention may further be enhanced as a consequence of the wavelength-selective mirror, which specifically prevent the creation of escape cones.

It will be evident to those skilled in the art that the invention is not limited to the details of the foregoing illustrative embodiments and that the present invention may be embodied in other specific forms without departing from the spirit or essential attributes thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A luminescent solar concentrator (LSC) comprising:
a composite substrate comprising:
an apical surface of the composite substrate comprising a first film including a first film edge surface and containing a first luminescent compound, wherein an apical surface of said film is proximal to a first wavelength-selective mirror, said first wavelength-selective mirror being transmissive for a range of light wavelengths and reflective for wavelengths corresponding to those at which said first luminescent compound emits light;
a second film positioned beneath said first film, wherein said second film includes a second film edge surface and contains a second luminescent compound, and an apical surface of said second film is proximal to a second wavelength-selective mirror, said second wavelength-selective mirror being transmissive for a range of light wavelengths and reflective for wavelengths corresponding to those at which said second luminescent compound emits light,
said first luminescent compound emits light at a wavelength which is longer than that at which said second luminescent compound emits light;
a basal surface comprising a third wavelength-selective mirror, said third wavelength-selective mirror being reflective for wavelengths corresponding to those at which luminescent compounds positioned thereabove in the composite substrate emit light;
a transparent body positioned between a basal surface of said second luminescent film and an apical surface of said third wavelength-selective mirror; and
a photovoltaic cell, the photovoltaic cell on the first film edge and the photovoltaic cell on the second film edge.

2. The luminescent solar concentrator of claim 1, wherein said first luminescent compound absorbs light at wavelengths which correspond to or longer than those at which said second luminescent compound emits light.

3. The luminescent solar concentrator of claim 1, wherein said composite substrate further comprises a third film containing a third luminescent compound, wherein an apical surface of said third film is proximal to a fourth wavelength-selective mirror, said mirror being transmissive for a range of light wavelengths and is reflective for wavelengths corresponding to those at which said third luminescent compound emits light and said third film being proximal to a basal surface of said second film and wherein said second luminescent compound emits light at wavelengths which are longer than those at which said third luminescent compound emits light.

4. The luminescent solar concentrator of claim 3, wherein said second luminescent compound absorbs light at wavelengths which correspond to or are longer than those at which said third luminescent compound emits light.

5. The luminescent solar concentrator of claim 3, wherein said first luminescent compound emits light in a range of from about 550-650nm.

6. The luminescent solar concentrator of claim 5, wherein said second luminescent compound emits light in a range of from about 425-575 nm.

7. The luminescent solar concentrator of claim 6, wherein said third luminescent compound emits light in a range of from about 350-450 nm.

8. The luminescent solar concentrator of claim 1, wherein said transparent body is comprised of a glass or plastic.

9. The luminescent solar concentrator of claim 5, wherein said transparent body is comprised of an optical-grade acrylic polymer.

10. The luminescent solar concentrator of claim 1, wherein at least one of said first film and said second film comprises a sol-gel matrix or a polymer.

11. The luminescent solar concentrator of claim 7, wherein at least one of said first film, second film and third film comprises poly(methyl methacrylate) (PMMA).

12. The luminescent solar concentrator of claim 1, wherein said first luminescent compound and said second luminescent compound absorb light of a wavelength in a range of between about 300 nm to about 700 nm.

13. A solar collection assembly comprising an array of the luminescent solar concentrators of claim 1, wherein each concentrator is placed edge to edge with respect to an adjoining concentrator and at least one photovoltaic cell is disposed between each of the edge intersections.

14. The luminescent solar concentrator of claim 1, wherein the photovoltaic cell is positioned adjacent at least one edge of said composite substrate and receives emitted photons from said first and second luminescent compounds, reflected photons from said mirrors, or combinations of emitted photons and reflected photons.

* * * * *